United States Patent [19]

Herrmann

[11] Patent Number: 5,253,214
[45] Date of Patent: Oct. 12, 1993

[54] HIGH-PERFORMANCE MEMORY CONTROLLER WITH APPLICATION-PROGRAMMABLE OPTIMIZATION

[75] Inventor: James F. Herrmann, Rochester, N.Y.

[73] Assignee: Eastman Kodak Company, Rochester, N.Y.

[21] Appl. No.: 766,302

[22] Filed: Sep. 27, 1991

[51] Int. Cl.$^5$ .......................... G11C 7/00; G11C 8/00
[52] U.S. Cl. ..................................... 365/233; 365/203
[58] Field of Search ........................... 365/233, 203

[56] References Cited

U.S. PATENT DOCUMENTS

| | | | |
|---|---|---|---|
| 3,969,706 | 7/1976 | Proebsting et al. | 365/189.02 |
| 4,513,371 | 4/1985 | Celio | 395/400 |
| 4,581,722 | 4/1986 | Takemae | 365/230.06 |
| 4,796,232 | 1/1989 | House | 365/222 |
| 4,839,856 | 6/1989 | Tanaka | 395/425 |
| 4,918,645 | 4/1990 | Lagoy, Jr. | 395/425 |
| 4,924,375 | 5/1990 | Fung et al. | 395/425 |
| 4,933,910 | 6/1990 | Olson et al. | 365/238.5 |
| 4,954,951 | 9/1990 | Hyatt | 395/425 |
| 4,984,209 | 1/1991 | Rajaram et al. | 365/222 |
| 5,027,326 | 6/1991 | Jones | 365/221 |
| 5,034,917 | 7/1991 | Bland et al. | 365/203 |

Primary Examiner—Eugene R. LaRoche
Assistant Examiner—Michael Kessell
Attorney, Agent, or Firm—Mark Z. Dudley

[57] ABSTRACT

A memory controller (18) for controlling a multiplexed-address memory (14) includes a programmable timer (22) whose time-out period can be controlled by the memory-access device (12) to which the memory controller (18) provides memory access. During an idle period after a memory access, the controller's memory operator (20) keeps the row-address-strobe signal asserted, and thereby permits page-mode addressing on the next cycle, until the counter (22) times out, at which point the memory operator (20) releases the row- address-strobe line and thereby initiates the pre-charge operation that is required before a row-address change. The memory access device (12) can thus change the time for which the row-address-strobe signal is kept asserted after a cycle to different values for different applications that it is running. The memory-access device (12) can thus optimize, on an application-specific basis, the compromise between the pre-charge penalties of page misses and the column-address-only benefits of page hits.

2 Claims, 3 Drawing Sheets

HIGH-PERFORMANCE MEMORY CONTROLLER WITH APPLICATION-PROGRAMMABLE OPTIMIZATION

BACKGROUND OF THE INVENTION

The present invention is directed to memory controllers and in particular to controllers for multiplexed-address memories.

Two of the most remarkable aspects of computer development in recent times have been microprocessor-speed increases and computer users' seemingly unlimited appetite for memory capacity. Because of reductions in integrated-circuit-chip feature sizes and improvements in architecture, microprocessor speed has increased rapidly, and much of the increased memory-capacity demand has resulted from the complexity of the human-to-computer interface problem.

Like microprocessors, memory circuits have enjoyed some speed increase. Memory-speed increases have not been nearly as great as microprocessor-speed increases, however, and memory access time has accordingly been the limiting factor in many computer applications.

Among the factors that slow the operation of integrated circuits generally and memory circuits in particular are propagation delays resulting from signal-path lengths. Significant speed reductions accordingly result from decreasing memory-chip size. Moreover, the sizes of many products are influenced significantly by their memory sizes. The memory type of choice for most large semiconductor memories is accordingly the dynamic random-access memory (DRAM), which employs charge storage to retain information. It thus requires fewer transistors—and thus less space—for a given memory capacity than static RAMs do.

The most popular type of DRAM is the multiplexed-address version, which employs address multiplexing to limit chip size further. In operation, a transition in a row-address-strobe (RAS) signal strobes half of the address bits (the "row address38 ) from the DRAM's address terminals into address registers in the DRAM. The remaining address bits (the "column address") are then applied to the address terminals, and a transition in a column-address-strobe (CAS) signal causes the requested access to occur at the address specified by the concatenation of the internal-register contents and the signals that are on the address lines at the time of the CAS transition. By employing multiplexing, such a chip requires only half as many address terminals as it otherwise would, and it thereby saves space.

Of course, the need to apply the address signals in two steps compromises to some extent the speed advantage that the size reduction affords. Since overall computer operation is so dependent on memory access time, therefore, memory manufacturers have developed "page-mode" addressing to circumvent this problem to some extent. In accordance with this technique, the chip is so made that it does not require a separate RAS transition for every memory access. Specifically, if the row address for a given access is the same as that for the previous access, that access can be caused by simply applying a second CAS transition with the new column address, i.e., without applying a second RAS transition. All that is required is that the RAS signal be held at the (asserted) level that it assumed as a result of the strobing transition in the previous access. This causes the DRAM to retain the row address for use in the next access.

Computer makers and others have accordingly exploited this feature by employing a type of memory controller that responds to a sequence of memory-access requests by keeping the RAS line asserted until it receives a refresh request or a request for access to a location on a different "page," i.e., to a location having a different row address. When the memory controller receives a different row address, it deasserts the RAS line for a period of time necessary for the chip's sense amplifiers and bit lines to "precharge," as they must in all DRAMs before a row-address change. The row address is then applied to the chip and strobed in with a new RAS assertion, and operation proceeds in the normal manner.

Some memory-controller designers have extended this approach. For instance, some memory controllers keep the RAS line asserted, even when no memory access is pending, until a new access is requested or (in the cases of a dynamic memory) a refresh operation must be performed. Indeed, some designers have gone to the extent of causing the controller to re-apply the previous row address to the chip after a refresh operation.

Actually, this expedient of keeping the RAS line asserted during idle times can exact a penalty when a row-address change occurs. If the RAS line were not held, any idle time between memory accesses could be used for precharging, and this would reduce or eliminate the pre-charge delay involved in the next memory access. Since the majority of memory accesses in most applications are directed to the same pages as the accesses that immediately precede them, however, the speed benefits that result from page "hits" greatly outweigh the speed penalties that result from page "misses."

SUMMARY OF THE INVENTION

I have made a further increase in effective memory speed by recognizing and taking advantage of the fact that the likelihood of a page change generally increases with the length of time for which a memory has been idle but that this relationship between page-change probability and idle time varies from one application to another. Specifically, I have made an improvement in a certain type of memory controller adapted to receive access signals from a memory-access device. In response to the access signals, a memory controller of this type controls a page-mode multiplexed-address memory, which receives address, row-address-strobe, and column-address-strobe signals from the controller. As was stated above, such a memory keeps a row address latched in it in response to a first, hold state of the row-address-strobe signal, and it precharges in response to a second, precharge state of that signal.

In accordance with the present invention, the memory controller includes a programmable timer. The timer is responsive to a program signal to store a duration value that the program signal sets, and it generates a timeout signal when the controller has been idle with the row-address-strobe signal in the hold state for a time interval of a duration set by the program signal.

The controller additionally includes a memory operator connected to receive the timeout signal. It is the memory operator that, like similar parts of previous controllers, is responsive to the access signals to access the memory by applying address, row-address-strobe, and column-address-strobe signals to it. In accordance with the present invention, moreover, the memory operator keeps the row-address-strobe signal in the hold state during idle periods after an access until it receives the timeout signal. It then switches the row-address-strobe signal to its precharge level.

A processor or other memory-access device can thus program the controller to hold the RAS line only so long as the probability of obtaining the page-mode benefit outweighs that of suffering the precharge penalty.

BRIEF DESCRIPTION OF THE DRAWINGS

These and further features and advantages of the present invention are described in connection with the accompanying drawings, in which.

DETAILED DESCRIPTION OF ILLUSTRATIVE EMBODIMENTS

Figure 1:
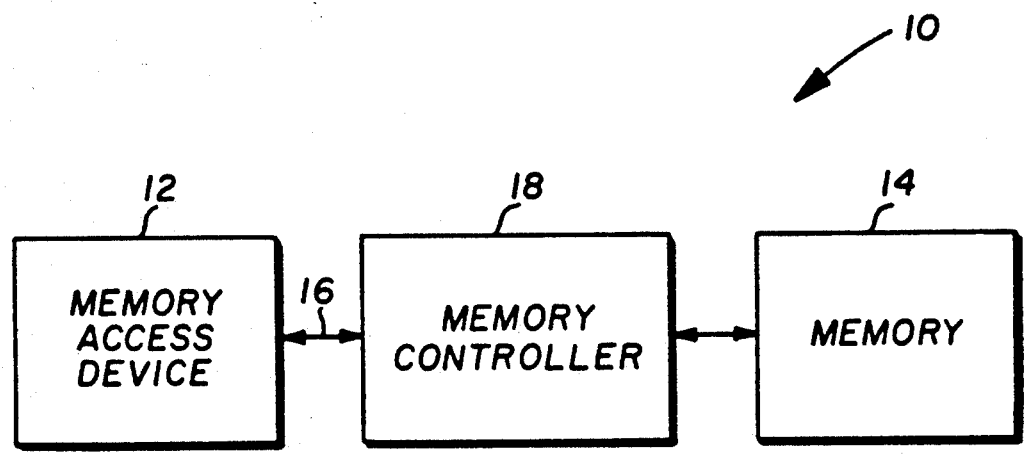
FIG. 1 is a block diagram of a computer system in which the teachings of the present invention can be employed.

FIG. 1 is a block diagram of a computer system 10 employing a processor or other memory-access device 12 that stores and uses information stored in a memory 14. For various reasons, the memory-access device will place on its communications bus 16 memory-access requests that follow a protocol to which the memory 14 cannot directly respond. For instance, the address signals on bus 16 typically are not in the multiplexed form that the memory 14 requires. Also, those signals may represent virtual addresses rather than the physical addresses that the memory 14 requires.

For these reasons and others, most systems employ a memory controller such as controller 18 to operate the memory in response to requests from the memory-access device 12. According to the present invention, the memory controller 18, in addition to performing various conventional memory-controller functions, is programmable to vary the duration for which it keeps RAS asserted during an idle interval, i.e., during an interval in which no memory-access request is pending and no refresh operation occurs.

Figure 2:
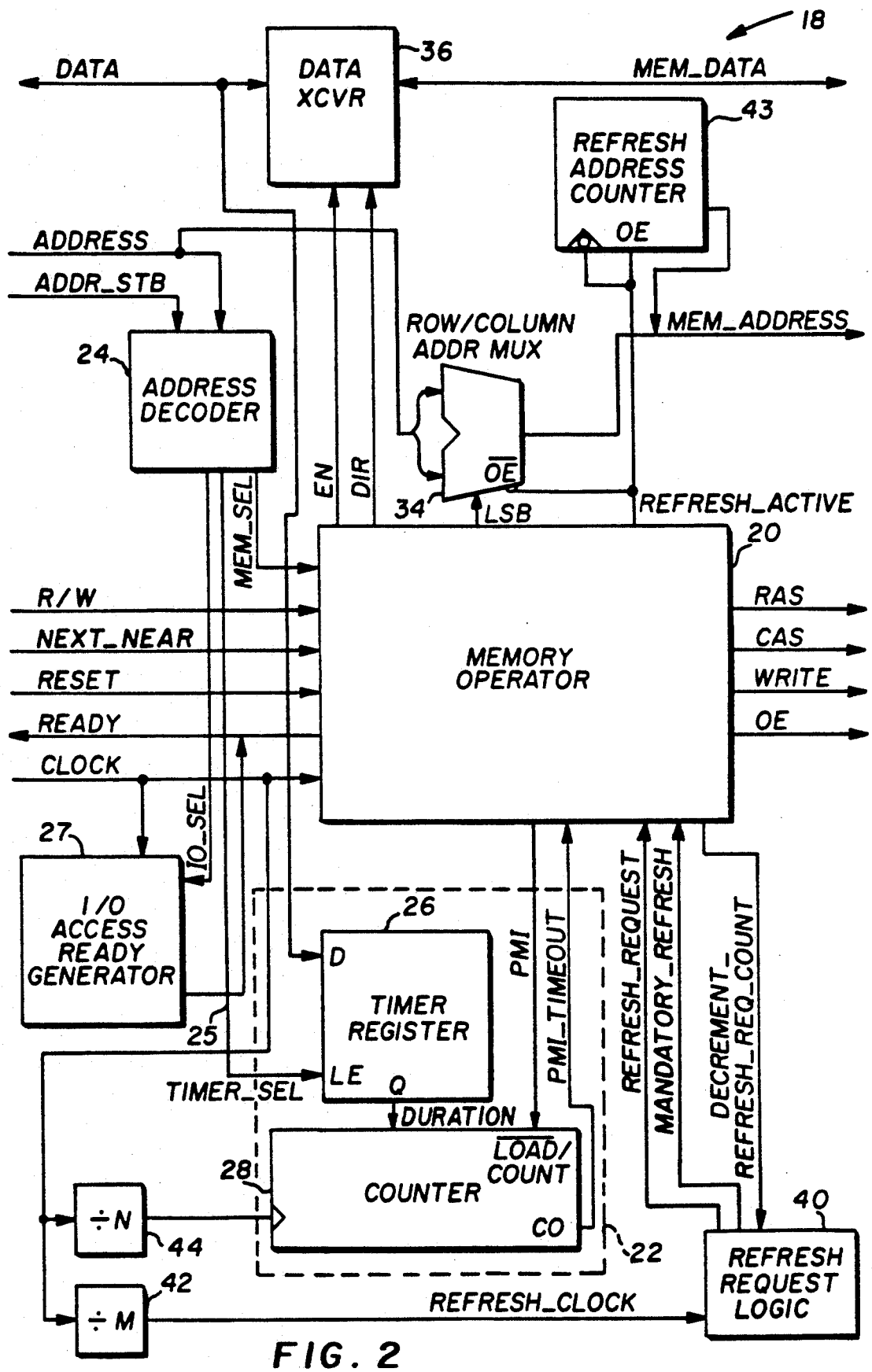
FIG. 2 is a more-detailed block diagram of the memory controller in that computer system.

FIG. 2 depicts the memory controller 18 and includes signal lines for carrying signals illustrative of the type that a typical memory-access device uses in requesting access to a memory. Those skilled in the art will recognize that communications protocols vary greatly among computer systems and among different buses within a computer system. Therefore, the various lines that FIG. 2 depicts are merely illustrative; although most communications protocols would require lines having functions similar to most of those depicted, some may omit some of them, and most will require others not shown. However, those skilled in the art will recognize the functions that these lines represent and will be able to make the adaptations appropriate for different communications protocols.

A typical communication bus will include a number of ADDRESS lines as well as a number of DATA lines, although some systems multiplex addresses and data on the same lines. An ADDRESS_STB signal, whose transition indicates the validity of the ADDRESS signal, also is typical. Most buses will also have a common RESET line, to which system components respond by assuming a defined initial state. An R/W (read/write) signal to indicate the direction of data flow is also typical, and synchronous systems will employ a CLOCK signal to keep the various components in synchronism. For the sake of simplicity, we will assume that the access device is like certain microprocessors that produce a NEXT_NEAR signal to indicate whether the more-significant bits of the ADDRESS signal have changed since the last access.

Under the control of a memory operator 20, the controller responds to these signals by applying to the memory 14 those signals that the memory requires to comply with the access request. It notifies the memory-access device 12 of its progress by means of a READY signal, whose assertion indicates that the controller has completed the operation. In a read operation, this means that the data on the DATA lines are valid. In a write operation, this means that they no longer need to be.

To take advantage of the teachings of the present invention, the memory-access device 12 addresses a programmable timer 22 by placing the timer's address on the ADDRESS lines, i.e., by transmitting a value that an address decoder 24 has been arranged to recognize as the address of the timer. When an ADDRESS_STB transition strobes the timer's address into the decoder 24, the decoder responds by applying a strobe signal TIMER_SEL on line 25 to a timer register 26, which accordingly stores the value represented by the memory-access-device-generated DATA signal. This value represents the time-out period that the programmable timer 22 is to assume. As will be seen below, this time-out period indicates how long the RAS signal is to be held when the memory is idle. At the same time, the address decoder 24 recognizes the received address as being one of the system I/O addresses and accordingly applies an IO_SEL signal to a READY-signal generator 27, which begins timing a predetermined I/O-device cycle time. At the end of that time, generator 27 asserts READY to indicate that enough time has passed for the register loading to have been completed.

The register 26 in turn applies a DURATION signal representative of the stored value to a counter 28. Normally, the memory operator 20 applies a de-asserted PMI (Page Mode Idle) signal to the counter 28, which causes it to load in the DURATION value. Having in this manner loaded into the controller 18 a RAS hold-interval value characteristic of the particular application program that it is about to run, the access device 12 proceeds to run that application, which typically involves obtaining access to the memory. When it requests an access to the memory, the access device places on the ADDRESS lines signals representing an address in the memory's address space, and it asserts ADDR_STB when those signals are valid. The address decoder 24 responds to an address within the memory's address space by asserting MEM_SEL (MEMory SElected) and applying it to the memory operator 20, whose operation is given in simplified form by the state-transition diagram of FIG. 3.

The memory operator 20 is initially in the idle state A, in which it remains so long as neither MEM_SEL nor another signal REFRESH_REQUEST, to be described below, is asserted. When it receives the MEM_SEL signal in the idle state A, the memory operator 20 proceeds to the RAS state B, in which it asserts RAS. The RAS transition causes the memory 14 to latch into its internal memory registers the ten most-significant bits of the ADDRESS signal, which a multiplexer 34 forwards to the memory's address terminals.

The memory operator 20 then proceeds to the next, select-column-bits state C, in which it asserts an LSB signal. LSB's assertion causes multiplexer 34 to forward to the memory 14 the less-significant bits of the ADDRESS signal. Holding the LSB signal asserted, the memory controller 24 proceeds to the next, CAS state D, in which it asserts the CAS signal and thus causes an access of the memory location specified by the concatenation of the current MEM_ADDRESS signal with the higher-order bits strobed in in response to the RAS transition. If the R/W signal from the access device indicates a read operation, the memory operator applies CAS with the WRITE signal de-asserted, and, for most types of memory chips, an OE (Output Enable) signal is asserted so that the memory applies the addressed contents to MEM_DATA lines. Also, the memory operator 20 applies to a data transceiver 36 a DIR signal, which specifies that the transceiver is to forward to the DATA lines the signals on the MEM_DATA lines, and it asserts an EN signal to enable the data transceiver 36.

If the R/W signal indicates a write operation, on the other hand, the OE, WRITE, and DIR signals have the opposite values. In both cases, the operator 20 asserts READY in the CAS state to notify the memory-access device that read data are valid or that write data have been written.

If MANDATORY_REFRESH, whose purpose will be described below, is not asserted, the operator next proceeds to the PMI (Page Mode Idle) state E. Having been asserted in the RAS state B, the RAS signal remains asserted in states C, D, and E. The CAS signal, on the hand, is de-asserted as soon as the memory operator switches from state D to state E, as is READY. In response to READY's deassertion, the memory-access device deasserts ADDR_STB, and MEM_SEL is accordingly de-asserted until the memory-access device again indicates the presence of a valid address by asserting ADDR_STB.

It is state E that manifests the distinguishing features of the present invention. Some prior-art systems have a similar state, in which they remain so long as no further memory-access request and no request for a memory-refresh operation occur. In many ways, that state is the same in memory operator 20, as can be seen by temporarily assuming the deassertion of MANDATORY REFRESH and another signal PMI_TIMEOUT, which will also be described below.

Specifically, if the memory operator 20 receives MEM SEL in state E, it responds in one of two ways. If, as is usually the case, the NEXT_NEAR signal is asserted, thereby indicating that the new access is directed to the same page as the previous one, the memory operator returns to state D and operates the memory by causing the required transition in the CAS signal. Since RAS has been held since the last access, the memory has kept the high-order bits from the previous operation latched into an internal address register, and the access occurs at the location addressed by the concatenation of those contents with the less-significant bits from the multiplexer 34, which forwards them because the memory operator 20 keeps LSB asserted in states C, D, and E.

If the access is directed to a new page, on the other hand, NEXT_NEAR is not asserted, and the memory operator goes from state E to a page-fault state G, in which it deasserts RAS so as to initiate RAS precharge cycles. The operator 20 then proceeds to state A, in which the precharge cycles are completed. Then, because MEM_ACC_REQ is still present, the memory controller proceeds to state B, in which it asserts RAS, and a RAS/CAS cycle proceeds in the manner described above.

Although the broader teachings of the invention can be practiced in a controller for any type of multiplexed-address memory, the typical multiplexed-address memory is a dynamic device, i.e., one that requires refreshing in order to hold its contents. The illustrated embodiment is accordingly depicted as a dynamic-memory controller; it includes refresh-request logic 40 for requesting refresh operations. All memory locations must be refreshed within a maximum memory-manufacturer-specified refresh period. A divide-by-M counter 42 produces a pulse train whose period is equal to this refresh period (or some shorter refresh period) divided by the number of memory rows. Whenever the refresh-request logic 40 receives a pulse from frequency divider 42, it increments an internal counter. The refresh-request logic 40 asserts a REFRESH_REQUEST signal when this counter has a value other than zero.

This signal indicates to the memory operator 20 that it should perform a refresh operation. If MEM_SEL is de-asserted in idle state A, the memory operator 20 responds to such a request by proceeding to a refresh-service routine, represented in FIG. 3 as a plurality of states $F_x$, which together refresh one memory row in a conventional manner. As part of this routine, the memory operator 20 increments a cyclic refresh-address counter 43 and enables its output onto the MEM_ADDRESS lines by asserting REFRESH_ACTIVE, which also disables the multiplexer 34. When the memory operator has refreshed a row, it asserts DECREMENT_REFRESH_REQ_COUNT and thereby causes the refresh-request logic 40 to decrement its internal counter.

If the resultant count is zero, the refresh-request logic 40 de-asserts REFRESH_REQUEST, and the memory operator 20 proceeds from the refresh-service routine back to the idle state A. If decrementing the refresh-request logic's internal counter does not result in a count of zero, then the refresh-service routine refreshes the next memory row, and this continues until the refresh-request counter has been decremented to zero.

When the state machine is not in the idle state A or in the refresh-service routine $F_x$, it does not respond to a refresh request. Since the operator 20 can operate for quite some time without ever reaching the idle state A, the necessary refresh operations would not occur—and the memory contents would be lost—if no other provisions were made. Accordingly, the refresh-request logic 42 asserts a MANDATORY_REFRESH signal when its internal counter reaches its maximum value. As FIG. 3 indicates, the memory operator 20 responds to this signal in its page-mode-idle state E by proceeding to the refresh-service states $F_x$. From its CAS state D, the memory operator responds to MANDATORY_REFRESH by proceeding to the refresh-service states $F_x$ by way of an abort state H. In this way, refresh service is assured.

Figure 3:
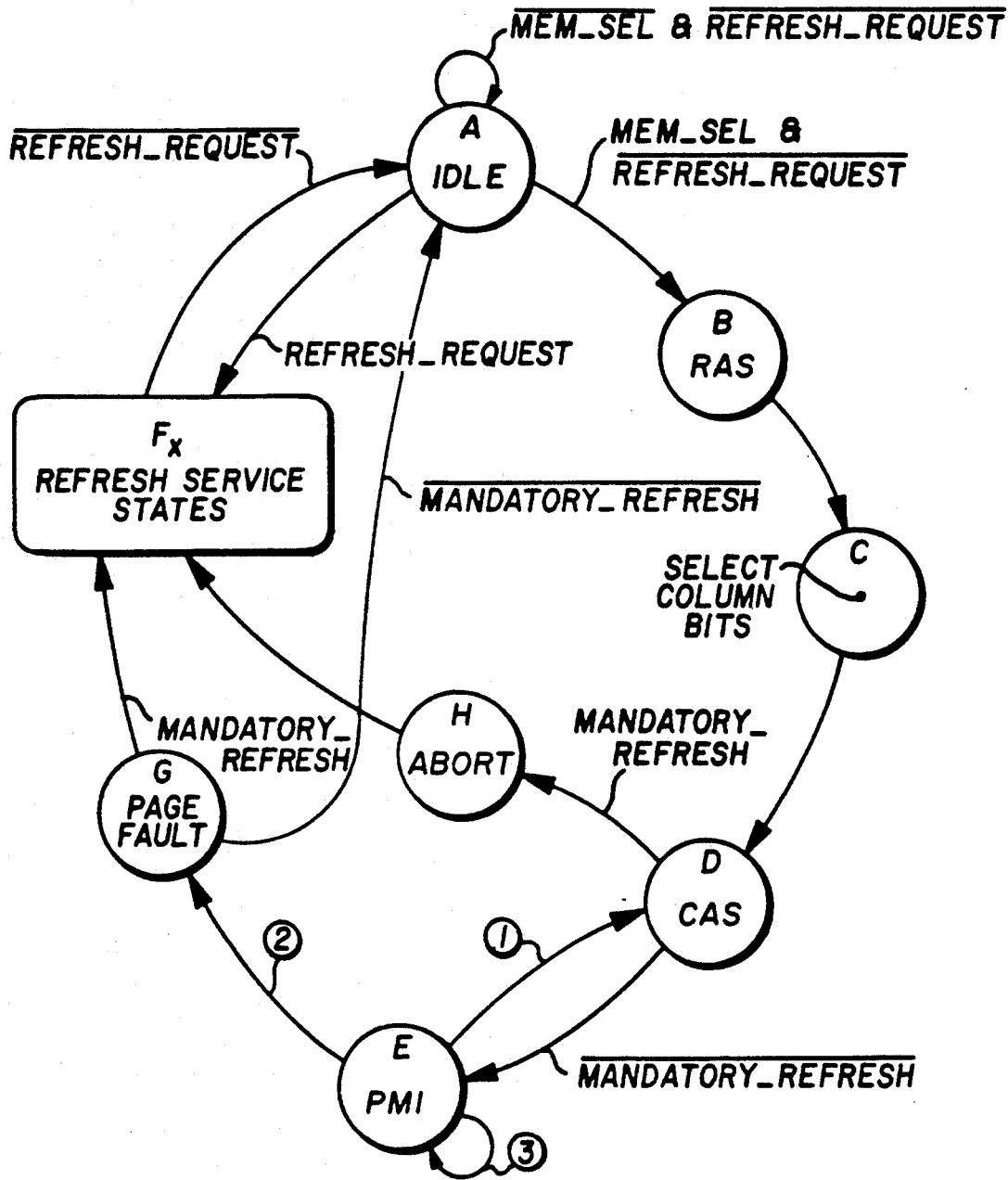
FIG. 3 is a conceptual state-transition diagram that depicts the operation of the memory operator and the memory controller of FIG. 2.

A digression is appropriate at this point to repeat that the FIG. 3 diagram is simpler than a complete diagram for a typical practical embodiment of the present invention would be. Most would include additional states, like states G and H, that simply add cycles to accommodate the timing requirements of the particular memory-access devices with which they are to be used. Additionally, further states might be required to, for instance, enable the operator to treat read requests differently from write requests in accordance with the memory-access device's timing requirements. But the diagram of FIG. 3 demonstrates the general type of behavior that a memory operator would exhibit.

The page-mode-idle state E as described so far is similar to that of some types of prior-art memory controllers. That is, it is a RAS-holding state from which the controller departs in response to a refresh or memory-access request. According to the present invention, however, there is another situation in which the memory operator 20 leaves the page-mode-idle state E. Specifically, when the memory operator 20 initially assumes the page-mode-idle state E, it asserts a PMI (Page Mode Idle) signal, which causes the counter 28 to begin counting down in response to counter-clock pulses from the divide-by-N counter 42. After a number of such pulses equal to the value that DURATION represented just before PMI was asserted, the counter 28 generates an output PMI_TIMEOUT. If a same-page memory-access request still is not pending, the memory operator 20 responds by assuming page-fault state G and then, if MANDATORY_REFRESH is not asserted, idle state A. The memory operator 20, being in state A, de-asserts the RAS signal and thereby initiates RAS precharge so that the system will not have to suffer the precharge delay when the next memory-access request is made.

The choice of the DURATION value determines the behavior of the system. If DURATION is set to zero, the controller can emulate prior-art controllers of the type that de-assert RAS during any idle periods. Setting DURATION to a value that exceeds the mandatory-refresh period, on the other hand, causes it to emulate prior-art controllers of this type that assert RAS continuously during idle periods. To take advantage of the particular features of the present invention, however, the DURATION value should be chosen in accordance with the relationship between the length of an idle period and the probability that the next access will be directed to the same page as the previous access.

It is well known that a memory access is most likely, in most applications, to be directed to the same page as the previous one. This probability tends to fall with the length of any idle time between these accesses, however, and in many applications the probability falls enough after a certain length of idle time that the precharge-penalty expectation exceeds that of the CAS-only-cycle benefit. When the idle time reaches that level, then, RAS should be dropped, and timer 22 represents a mechanism for doing so. Moreover, since the timer 22 is programmable in the illustrated embodiment, the DURATION value can be changed with application in recognition of the fact that the probability function changes with application, too.

In light of the foregoing description, it is apparent that a memory controller incorporating the teachings of the present invention can be used to optimize the average multiplexed-address-memory access time on an application-specific basis. It thus constitutes a significant advance in the art.

What is claimed:

1. A memory controller, adapted to receive access signals from a memory-access device, for responding thereto by controlling a page-mode multiplexed-address memory adapted for reception of memory-address, row-address-strobe, and column-address-strobe signals, the memory keeping a row address latched therein in response to a first, hold state of the row-address-strobe signal and precharging in response to a second, precharge state of the row-address-strobe signal, the memory controller comprising:

A) a programmable timer responsive to a program signal to store a duration value set thereby and generate a timeout signal when the controller, has been idle, along with the row-address-strobe signal in the hold state, for a time interval the duration of which stored duration value represents; and B) a memory operator connected to receive the timeout signal and being responsive to the access signals to access the memory by applying address, row-address-strobe, and column-address-strobe signals thereto, the memory operator keeping the row-address-strobe signal in the hold state during idle periods after an access until it receives the timeout signal and then switching the row-address-strobe signal to its precharge level.

2. A memory controller as defined in claim 1 wherein:

A) the access signals include address and accompanying data signals representing address and data values, respectively;

B) the programmable timer is associated with a predetermined timer address; and

C) the programmable timer stores as the duration values the values represented by data signals that accompany address signals representing the predetermined timer address, the programmable timer thereby treating the access signals that include such address signals as program signals.

* * * * *